United States Patent [19]

Kim et al.

[11] Patent Number: 5,234,864

[45] Date of Patent: Aug. 10, 1993

[54] METHOD FOR INTERCONNECTING LAYERS IN A SEMICONDUCTOR DEVICE USING TWO ETCHING GASES

[75] Inventors: Jin-hong Kim, Kyunggi; Chang-lyong Song, Seoul, both of Rep. of Korea

[73] Assignee: Samsung Electronics Co., Ltd., Kyunggi, Rep. of Korea

[21] Appl. No.: 803,448

[22] Filed: Dec. 6, 1991

[51] Int. Cl.⁵ .................. H01L 21/44; H01L 21/306
[52] U.S. Cl. ..................................... 437/197; 156/646; 148/DIG. 131
[58] Field of Search ............... 148/DIG. 50, DIG. 51, 148/DIG. 131; 156/625, 643, 650, 651, 652; 437/194, 196, 197

[56] References Cited

U.S. PATENT DOCUMENTS

| | | | |
|---|---|---|---|
| 4,325,984 | 4/1982 | Galfo et al. | 156/646 |
| 4,412,885 | 11/1983 | Wang et al. | 156/646 |
| 4,474,642 | 10/1984 | Nakane et al. | 156/646 |
| 4,592,801 | 6/1986 | Hara et al. | 156/646 |
| 4,742,026 | 5/1988 | Vatus et al. | 148/DIG. 131 |
| 4,981,550 | 1/1991 | Huttemann et al. | 437/194 |
| 5,082,801 | 1/1992 | Nagata | 437/197 |

*Primary Examiner*—Tom Thomas
*Assistant Examiner*—C. Chaudhari
*Attorney, Agent, or Firm*—Rothwell, Figg, Ernst & Kurz

[57] ABSTRACT

A method for interconnecting layers in a semiconductor device is disclosed. The device includes a lower conductive layer formed by capping a second conductive layer on a first conductive layer, a contact window formed in an inter-insulating layer on the lower conductive layer, and an upper conductive layer connected to the lower conductive layer through the contact window. The contact window is formed by removing a portion of the inter-insulating layer where the contact will be formed using a first etching gas, and removing a portion of the second conductive layer where the contact will be formed using a second etching gas. The contact resistance becomes uniform by preventing the formation of a non-volatile mixture in the contact window, and the reliability of the device is improved by planarizing the surface of the lower conductive layer.

24 Claims, 2 Drawing Sheets

METHOD FOR INTERCONNECTING LAYERS IN A SEMICONDUCTOR DEVICE USING TWO ETCHING GASES

BACKGROUND OF THE INVENTION

The present invention relates to a method for manufacturing a semiconductor device, and particularly to a method for interconnecting layers in a semiconductor device, wherein a contact window is opened by a different etching method to make interlayer contact resistance uniform.

To attain high-speed operation, enhanced performance, and miniaturization in electrical appliances, efforts to increase the packing density in semiconductor memory devices have been accelerated. Further miniaturization and compact arrangement of elements provide the potential for higher integration in semiconductor devices. Accordingly, techniques are required which can shrink both the spacing between conductive layers connecting respective elements as well as their sizes, and which also can form the conductive layers on multiple layers (multilevel interconnection), which were in the past formed on a single layer.

FIGS. 1A, 1B, and 1C are sectional views for illustrating a conventional method for interconnecting layers in a semiconductor device, which can achieve reliable interconnection between conductive layers with minimum linewidths.

First, pure aluminum or an aluminum alloy in conjunction with a material such as 1% silicon, 0.5% copper, or 1% Si plus 0.5% Cu is deposited on a semiconductor substrate 10 to form a first conductive layer 100a. Then, after forming a second conductive layer 100b by depositing titanium nitride (TiN) on the first conductive layer, a lower conductive layer 100 is formed by patterning the first and second conductive layers through a photolithography process.

Since aluminum alloy or pure aluminum used as the first conductive layer has high reflexibility, which makes it difficult to form a minute pattern, titanium nitride is used as the second conductive layer to overcome the difficulty in the photolithography process due to decreased linewidth and spacing and increased stepped structure of the conductive layers. Removing these difficulties, which result from higher packing density, improves the reliability of the first conductive layer. That is to say, in the photolithography process that coats a photoresist layer over the whole surface of the first conductive layer 100a to expose and develop it, a small quantity of light projected during the exposure arrives at the first conductive layer with high reflexibility. As a result the light is reflected and diffused by the uneven surface of the conductive layer due to fine defects such as hillocks or voids, and projected again onto the photoresist layer which becomes unacceptably exposed.

As one solution to the difficulty in forming a minute pattern caused by the diffused reflection of light, a material having low reflexibility, such as titanium nitride, is used to cap the first conductive layer which protects the photoresist pattern from being damaged by diffused reflection. The titanium nitride capping also prevents the occurrence of fine defects such as hillocks and voids on the first conductive layer's surface. Generally, when a lower conductive layer consists solely of the first conductive layer, the conductive material (especially its surface) freely migrates while melting and recombining the aluminum ions of the first conductive layer, causing the hillocks and voids. However, the titanium nitride used as the second conductive layer controls the migration of the conductive material, and thus enables the prevention of fine defects.

The method for interconnecting layers additionally involves forming an inter-insulating layer 20 to planarize the whole surface of the resultant structure having the lower conductive layer 100 thereon and forming the inter-insulating layer 20 involves successively by coating an insulating material including an oxide layer of High Temperature Oxide (HTO) or Tetra-Ethyl-OrthoSilicate (TEOS) layer, and a Spin-On-Glass (SOG) layer (FIG. 1A). A photoresist pattern 72 is formed on the inter-insulating layer 20, in which a window is opened to expose a portion of the inter-insulating layer where a contact window will be formed. Then, an isotropic etching is performed on the inter-insulating layer 20 to remove a predetermined amount of the inter-insulating layer. A contact window 9 is formed by partially removing the inter-insulating layer and titanium nitride by means of a Plasma Ion Etching (PIE) or Reactive Ion Etching (RIE) method using a fluorine mixture ($CF_4$, $CHF_3$, etc.).

During this, since the bonding energy between titanium (Ti) ions and nitride (N) ions constituting the titanium nitride is approximately double the bonding energy between aluminum ions, a non-volatile compound ($Al_xF_y$) 50 is formed by the reaction of fluorine (F) ions present in the fluorine mixture used as the etching gas, with the aluminum (Al) ions included in the first conductive layer. The non-volatile compound 50 accumulates in the contact window 9 as illustrated in FIG. 1B. However, the non-volatile compound accumulated in the contact window is not easily removed by an $O_2$ plasma or an argon sputtering (Ar sputtering) method, so that the contact resistance between the upper conductive layer 200 and lower conductive layer 100 connected through contact window 9 (FIG. 1C) becomes irregular. This degrades the device's reliability.

SUMMARY OF THE INVENTION

Therefore, it is the object of the present invention to provide a method for interconnecting layers in a semiconductor device, in which the contact resistance between layers becomes uniform by forming a contact window through different etching methods to prevent the formation of a non-volatile compound, thereby enhancing the reliability of the device.

To achieve the object of the present invention, there is provided a method for interconnecting layers in the semiconductor device comprising forming a lower conductive layer by capping a second conductive layer on a first conductive layer, forming a contact window in an inter-insulating layer on the lower conductive layer, and connecting an upper conductive layer to the lower conductive layer through the contact window. The step of forming the contact window is performed by removing a portion of the inter-insulating layer, using a first etching gas; and removing a portion of the second conductive layer, using a second etching gas.

According to the present invention there is also provided a method for interconnecting layers in a semiconductor device having a lower conductive layer, a contact window, and an upper conductive layer, which comprises the steps of:

forming a first conductive layer composed of a material selected from a group consisting of aluminum alloy and pure aluminum;

forming a second conductive layer with low reflexibility on the whole surface of the first conductive layer;

forming the lower conductive layer by patterning the first and second conductive layers;

forming an inter-insulating layer by coating an insulating material over the whole surface of the structure;

forming the contact window by removing a portion of the inter-insulating layer on the lower conductive layer using a fluorine mixture;

removing the second conductive layer exposed through the contact window, using a chlorine mixture; and forming the upper conductive layer by evaporating and patterning a third conductive layer over the whole surface of the resultant structure.

BRIEF DESCRIPTION OF THE DRAWINGS

Other objects and advantages of the present invention will become more apparent by the following description with reference to accompanying drawings, in which.

DETAILED DESCRIPTION OF THE INVENTION

Figure 1A:
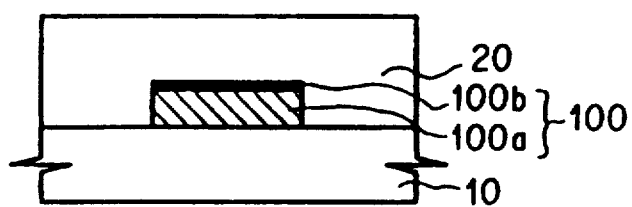
FIGS. 1A through 1C are sectional views showing a conventional method for interconnecting layers in a semiconductor device.
Figure 1B:
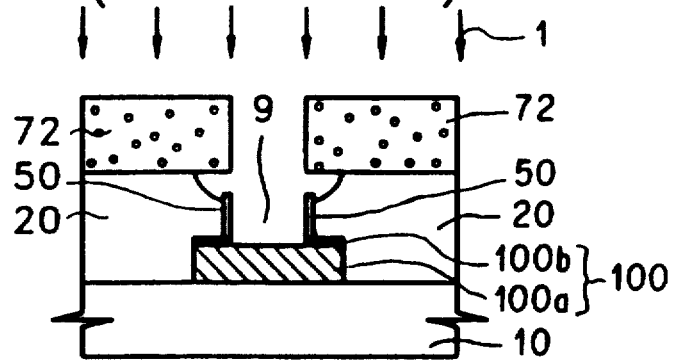
Figure 1C:
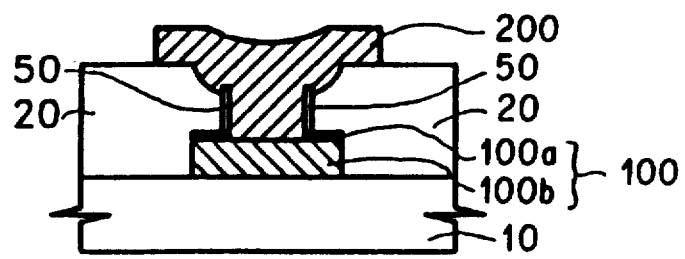
Figure 2A:
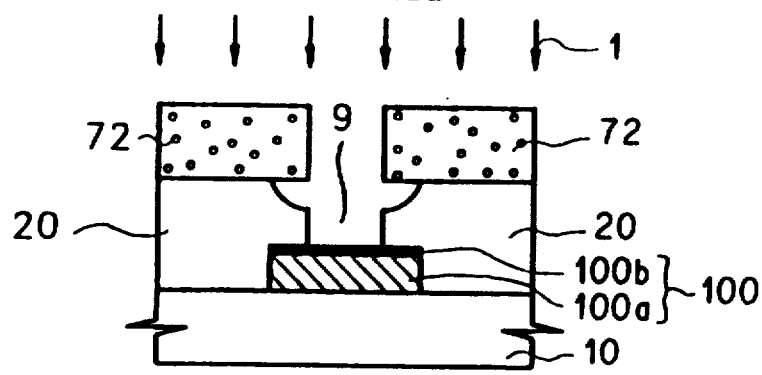
FIGS. 2A through 2C are sectional views showing a method for interconnecting layers in a semiconductor device according to the present invention.
Figure 2B:
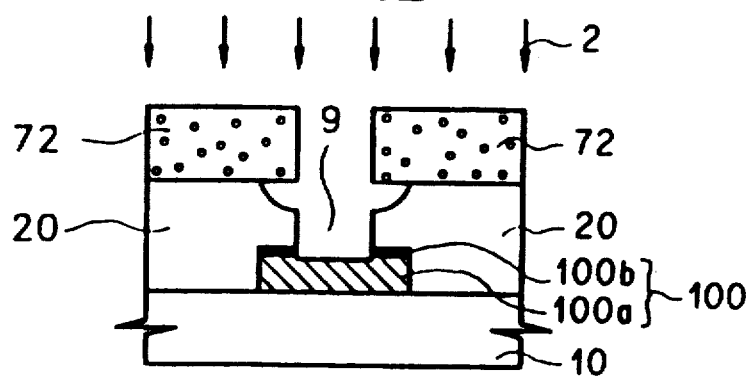
Figure 2C:
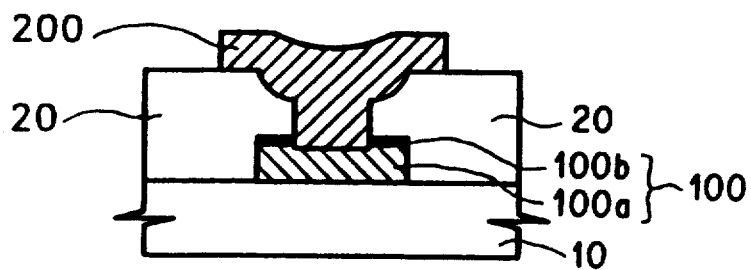

In FIGS. 2A through 2C illustrating an embodiment of the present invention which will be described below, the same reference numerals used in the foregoing description of FIGS. 1A through 1C will be used to refer to like parts. And detailed descriptions thereof will not be repeated.

FIG. 2A illustrates a process for forming a contact window 9. A photoresist pattern 72 is formed having a window to expose a portion of the inter-insulating layer where a contact window will be opened. By a method similar to that described with reference to FIGS. 1A and 1B, layer 20. Thus, a predetermined amount of the inter-insulating layer is removed from the region where the inter-layer connection will be formed to reduce the aspect ratio of the contact window. This represents one method for forming a reliable upper conductive layer. Successively, the inter-insulating layer is removed to open the contact window 9 by the plasma etching method or reactive ion etching method using a fluorine mixture such as $CF_4/CHF_3/O_2$ or $CHF_3/CF_4/He$. Sometimes, the etching using the fluorine mixture excessively proceeds until a portion of the second conductive layer 100b is removed. Thus, etching process should be performed after determining the endpoint to be etched so as not to expose the first conductive layer, since the fluorine mixture reacts with the first conductive layer, thereby forming a non-volatile mixture. Generally, the etching of the second conductive layer is harmless to the reliability of the device, until the etching is performed down to roughly half of the layer's initial thickness.

FIG. 2B illustrates a process for treating the surface of first conductive layer 100a. Using a chlorine mixture such as $BCl_3/Cl_2He$, the exposed second conductive layer is completely removed; concurrently removing a little bit of first conductive layer 100a in order to smooth its surface. Hence, when "1" is assumed as the etch rate of any one material among the materials forming the inter-insulating layer, the first conductive layer and the second conductive layer, conditions under which the chlorine mixture is applied, e.g., the ratio of $BCl_3$ to $Cl_2$, the pressure of the gas, and the radio frequency (RF) power are preferably adjusted to make the chlorine mixture etch materials other than the above selected one material at etch rates of about 0.7-1.3. Also, the preferable thickness of the etched first conductive layer is approximately 200Å-500Å. The two steps (using the fluorine mixture and the chlorine mixture) are performed in respective chambers.

FIG. 2C illustrates a process for forming an upper conductive layer 200, which is completed by evaporating and patterning a third conductive layer, e.g., an aluminum alloy or pure aluminum, over the whole surface of the resultant structure in which the contact window is formed.

In the method for interconnecting layers in the semiconductor device according to the present invention, the etching process to form the contact window is performed in two steps: removing a portion of the inter-insulating layer where the contact will be formed using a first etching gas, and removing a portion of the lower conductive layer with a second etching gas. This prevents the formation of a non-volatile mixture and makes the contact resistance uniform. Further, the surface of the lower conductive layer becomes smoothed, improving the reliability of the device.

It will be apparent that many modifications and variations could be easily effected by one skilled in the art without departing from the spirit or scope of the novel concepts of the present invention as defined in the appended claims.

What is claimed is:

1. A method for interconnecting layers in a semiconductor device comprising a lower conductive layer formed by capping a first conductive layer with a second conductive layer formed of material having low reflexibility, a contact window formed in an inter-insulating layer on said lower conductive layer, and an upper conductive layer connected to said lower conductive layer through said contact window, wherein said contact window is formed by the steps of:

removing a portion of said inter-insulating layer, using a first etching gas; and removing a portion of said second conductive layer, using a second etching gas.

2. A method for interconnecting layers in a semiconductor device as claimed in claim 1, wherein said first conductive layer is formed of a material selected from a group consisting of aluminum and aluminum alloy.

3. A method for interconnecting layers in a semiconductor device as claimed in claim 1, wherein said second conductive layer is formed of titanium nitride.

4. A method for interconnecting layers in a semiconductor device as claimed in claim 3, wherein said second conductive layer material has a thickness of about 300Å-600Å.

5. A method for interconnecting layers in a semiconductor device as claimed in claim 1, wherein said first etching gas is fluorine mixture.

6. A method for interconnecting layers in a semiconductor device as claimed in claim 5, wherein the mixture used as said fluorine mixture is a member selected from a group consisting of CHF$_3$/CF$_4$/He and CH$_4$/CHF$_3$/O$_2$.

7. A method for interconnecting layers in a semiconductor device as claimed in claim 1, wherein said second etching gas is a gas which does not generate a nonvolatile mixture when reacted with said first conductive layer material.

8. A method for interconnecting layers in a semiconductor device as claimed in claim 7, wherein said second etching gas is a chlorine mixture.

9. A method for interconnecting layers in a semiconductor device as claimed in claim 8, wherein said chlorine mixture is BCl$_3$/Cl$_2$/H$_2$.

10. A method for interconnecting layers in a semiconductor device as claimed in claim 1, wherein said step of removing said inter-insulating layer continues until said a predetermined thickness of said second conductive layer is removed.

11. A method for interconnecting layers in a semiconductor device as claimed in claim 10, wherein said predetermined thickness is less than 50% of the initial thickness of said second conductive layer.

12. A method for interconnecting layers in a semiconductor device as claimed in claim 1, wherein said step of removing said second conductive layer continues until a predetermined thickness of said first conductive layer is removed.

13. A method for interconnecting layers in a semiconductor device as claimed in claim 12, wherein said predetermined thickness is about 200Å to 500Å.

14. A method for interconnecting layers in a semiconductor device as claimed in claim 1, wherein said steps for removing said inter-insulating layer and said second conductive layer are performed in respective chambers.

15. A method for interconnecting layers in a semiconductor device as claimed in claim 1, wherein said second etching gas comprises a chlorine mixture of BCl$_3$/Cl$_2$/H$_2$ and said step of removing a portion of said second conductive layer is performed at a ratio of BCl$_3$ to Cl$_2$, a gas pressure, and a RF power, such that if "1" is assumed as an etch rate of any one material among materials forming said inter-insulating layer, said first conductive layer, and said second conductive layer, materials other than said any one material are removed at an etch rate in the range of 0.7–1.3.

16. A method for interconnecting layers in a semiconductor device having a substrate, a lower conductive layer, a contact window, and an upper conductive layer, said method comprising the steps of:
    forming a first conductive layer composed of a material selected from a group consisting of aluminum and aluminum alloy on the semiconductor substrate;
    forming a second conductive layer having a low reflexibility on the whole surface of said first conductive layer;
    forming said lower conductive layer by patterning said first and second conductive layers;
    forming an inter-insulating layer by coating an insulating material over the whole surface of the structure resulting from the patterning of said first and second conductive layers;
    forming said contact window by removing a portion of said inter-insulating layer on said lower conductive layer using a fluorine mixture;
    removing said second conductive layer exposes through said contact window, using a chlorine mixture; and
    forming said upper conductive layer by depositing and patterning a third conductive layer over the whole surface of the structure resulting from the previous two steps.

17. A method for interconnecting layers in a semiconductor device as claimed in claim 16, wherein said second conductive layer material is titanium nitride.

18. A method for interconnecting layers in a semiconductor device as claimed in claim 16, wherein said fluorine mixture is a member selected from a group consisting of CHF$_3$/CF$_4$/He and CF$_4$/CHF$_3$/O$_2$.

19. A method for interconnecting layers in a semiconductor device as claimed in claim 16, wherein said chlorine mixture is BCl$_3$/CL$_2$/H$_2$.

20. A method for interconnecting layers in a semiconductor device as claimed in claim 16, wherein said step of forming said contact window by removing the portion of said inter-insulating layer continues until a predetermined thickness of said second conductive layer is removed.

21. A method for interconnecting layers in a semiconductor device as claimed in claim 20, wherein said predetermined thickness is less than 50% of the initial thickness of said second conductive layer.

22. A method for interconnecting layers in a semiconductor device as claimed in claim 16, wherein said step of removing said second conductive layer exposed through said contact window continues until a predetermined thickness of said first conductive layer is removed.

23. A method for interconnecting layers in a semiconductor device as claimed in claim 22, wherein said predetermined thickness is about 200Å–500Å.

24. A method for interconnecting layers in a semiconductor device as claimed in claim 22, wherein said second etching gas comprises a chlorine mixture of BCl$_3$/Cl$_2$/H$_2$ and said step of removing a portion of said second conductive layer is performed at a ratio of BCl$_3$ to Cl$_2$, a gas pressure, and a RF power, such that if "1" is assumed as an etch rate of any one material among materials forming said inter-insulating layer, said first conductive layer, and said second conductive layer, materials other than said any one material are removed at an etch rate in the range of 0.7–1.3.

* * * * *

UNITED STATES PATENT AND TRADEMARK OFFICE
CERTIFICATE OF CORRECTION

PATENT NO. : 5,234,864
DATED : August 10, 1993
INVENTOR(S) : Jun-hong Kim et al

It is certified that error appears in the above-indentified patent and that said Letters Patent is hereby corrected as shown below:

On the Title page, item [30] insert the Foreign application Priority Data --Oct. 16, 1991 Korea 91-18232--.

Col. 2, line 9, change "thereon and forming" to --thereon. Forming--.

Col. 2, line 26, after "this" insert --stage--.

Col. 2, line 31, change "ions" to --ions,--.

Col. 3, line 38, change "parts. And" to --parts, and--.

Col. 3, line 45, after "1B," insert --isotropic etching is carried out to the inter-insulating--.

Col. 3, line 67, change "$BCl_3/CL_2He$" to --$BCl_3/Cl_2/HE$--.

Col. 6, line 26, change "$BCl_3/CL_2/H_2$" to --$BCl_3/Cl_2/H_2$--.

Signed and Sealed this

Fourteenth Day of March, 1995

Attest:

Attesting Officer

BRUCE LEHMAN

Commissioner of Patents and Trademarks